US008460117B2

(12) United States Patent
Ohtsuka et al.

(10) Patent No.: US 8,460,117 B2
(45) Date of Patent: Jun. 11, 2013

(54) POWER TRANSMISSION DEVICE

(75) Inventors: Junji Ohtsuka, Minato-ku (JP);
Kazuhiko Nishimiya, Minato-ku (JP);
Hideki Miura, Minato-ku (JP); Yasushi Koyama, Minato-ku (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 52 days.

(21) Appl. No.: 13/129,285

(22) PCT Filed: Nov. 14, 2008

(86) PCT No.: PCT/JP2008/070794
§ 371 (c)(1),
(2), (4) Date: May 13, 2011

(87) PCT Pub. No.: WO2010/055578
PCT Pub. Date: May 20, 2010

(65) Prior Publication Data
US 2011/0256942 A1    Oct. 20, 2011

(51) Int. Cl.
*F16C 3/00* (2006.01)

(52) U.S. Cl.
USPC .......................................... 464/178; 464/900

(58) Field of Classification Search
USPC .......................................... 464/93, 178, 900
See application file for complete search history.

(56) References Cited

U.S. PATENT DOCUMENTS

| 2,262,512 | A | * | 11/1941 | Musselman | 464/178 X |
| 2,449,654 | A | * | 9/1948 | Jessop | 464/900 |
| 2,534,738 | A | * | 12/1950 | Scott | 464/178 X |
| 6,597,255 | B1 | | 7/2003 | Turton | |
| 7,530,757 | B2 | * | 5/2009 | Toda et al. | 464/900 |

FOREIGN PATENT DOCUMENTS

| JP | 62 109494 | 7/1987 |
| JP | 7 35572 | 2/1995 |
| JP | 7 260853 | 10/1995 |
| JP | 8 326340 | 12/1996 |
| JP | 11 211623 | 8/1999 |
| JP | 2003-206929 | 7/2003 |
| JP | 2006 44479 | 2/2006 |
| JP | 2008-155803 A | 7/2008 |

OTHER PUBLICATIONS

U.S. Appl. No. 13/140,704, filed Jun. 17, 2011, Nishimiya, et al.
International Search Report issued Dec. 22, 2008 in PCT/JP08/070794 filed Nov. 14, 2008.
Extended European Search Report issued May 3, 2012 in patent application No. 08878124.0.
Office Action issued Nov. 20, 2012 in Japanese Patent Application No. 2010-537645 (with English-language translation).
Korean Office Action mailed Jan. 3, 2013 for Application No. 10-2011-7011372 with English translation, 6 pages.

* cited by examiner

*Primary Examiner* — Gregory Binda
(74) *Attorney, Agent, or Firm* — Oblon, Spivak, McClelland, Maier & Neustadt, L.L.P.

(57) ABSTRACT

A power transmission device that includes an electromagnetic wave-shielding wall partitioning a space and a space, a rotating shaft penetrating through the electromagnetic wave-shielding wall to transmit rotating drive force, and a bearing supporting the rotating shaft. The rotating shaft includes a first shaft member supported by the bearing, a shaft joint part provided on an end of the first shaft member, and a second shaft member rotating together with the first shaft member. The first shaft member and the second shaft member are formed of a conductive material, and the shaft joint part has an insulating part formed of an insulating material. An outer race component part of the bearing has an annular close-contact surface formed of a conductive material.

2 Claims, 3 Drawing Sheets

POWER TRANSMISSION DEVICE

TECHNICAL FIELD

The present invention relates to a power transmission device, and particularly to a power transmission device which penetrates through a shield wall for blocking the propagation of an electromagnetic wave, to transmit rotational driving force.

BACKGROUND ART

Conventionally, it has been a common practice to form an electromagnetic wave-shielded room for the purpose of shielding an externally intruding unnecessary electromagnetic wave and preventing leakage of an internally generated electromagnetic wave to the outside. An electromagnetic wave-shielded room is formed with an intended section being surrounded with a plate member of a conductive body and the plate member being grounded. When power is to be transmitted from one to the other of the inside and the outside of an electromagnetic wave-shielded room, a through hole is formed in a plate member for blocking the propagation of an electromagnetic wave, and a power transmission shaft penetrating through the through hole is provided, thereby allowing power to be transmitted through the plate member forming the electromagnetic wave-shielded room.

When an electromagnetic wave-shielded room is provided with a power transmission shaft in the above manner, in the event of leakage of a radio wave by way of the through hole or leakage of a radio wave transmitted through the shaft, the shielding performance against an electromagnetic wave would be degraded. In particular, the higher frequency an electromagnetic wave has, the more likely the electromagnetic wave is to be transmitted by way of the surface of the shaft due to the skin effect. In order to achieve improved shielding performance against an electromagnetic wave of a high frequency, it is necessary to block an electromagnetic wave leaking through the shaft surface. To that end, a technology has been proposed in which a through hole formed in a plate member of a conductive body is penetrated thorough by a sleeve made of metal so that leakage of an electromagnetic wave by way of the through hole is suppressed, and in which a direct-coupling shaft of an insulating material is inserted into the sleeve so that leakage of an electromagnetic wave by way of the shaft is also suppressed (for example, see Japanese Patent Laying-Open No. 8-326340 (Patent Document 1)).
Patent Document 1: Japanese Patent Laying-Open No. 8-326340

DISCLOSURE OF THE INVENTION

Problems to be Solved by the Invention

When using the technology as described in Japanese Patent Laying-Open No. 8-326340 (Patent Document 1) in which a sleeve made of metal is penetrated through by an insulating shaft, in order to sufficiently suppress leakage of a radio wave by way of the through hole, it is necessary to allow the sleeve to have a sufficiently long length, for example, to allow the sleeve to have a length of more than five times the inner diameter of the sleeve. There is, however, a problem that use of a long sleeve will enlarge the size of the device, resulting in the increased installation area and increased manufacturing cost of the device. There is a further problem that if the shaft penetrating through the long sleeve is fabricated with an insulating material such as FRP (Fiber Reinforced Plastics), application of excessive torque to the shaft would cause deformation or breakage of the shaft itself, and that therefore, rotational driving force transmitted by way of the shaft cannot be made greater.

The present invention has been made in view of the problems above, and a main object of the invention is to provide a power transmission device which penetrates through a shield wall for blocking the propagation of an electromagnetic wave, to transmit rotational driving force and in which leakage of an electromagnetic wave can be effectively suppressed without inviting enlargement of the size and degradation of the torque transmission capability of the device.

Means for Solving the Problems

The power transmission device according to the present invention includes an electromagnetic wave-shielding wall, a rotating shaft and a bearing. The electromagnetic wave-shielding wall partitions a first space and a second space adjacent to the first space and blocks propagation of an electromagnetic wave between the first space and the second space. The rotating shaft is rotatably provided and penetrating through the electromagnetic wave-shielding wall to transmit rotational drive force between the first space and the second space. The bearing rotatably supports the rotating shaft. The rotating shaft includes a first shaft member pivotally supported by the bearing, a shaft joint part provided on an end of the first shaft member on the second space side, and a second shaft member provided to be rotatable together with the first shaft member with the shaft joint part interposed between the first and second shaft members. The first shaft member and the second shaft member are formed of a conductive material. The shaft joint part has an insulating part which is formed of an insulating material and blocks propagation of an electromagnetic wave between the first shaft member and the second shaft member. The bearing includes an inner race component part and an outer race component part which are arranged opposite to each other. The inner race component part is formed to fit to the first shaft member and to be rotatable. The outer race component part is formed of a conductive material and fixed to the electromagnetic wave-shielding wall. The outer race component part has an annular close-contact surface in close contact with the electromagnetic wave-shielding wall.

Preferably, in the above-described power transmission device, a grounding member formed of a conductive material is further included. The grounding member is arranged to be in contact with an outer circumferential surface of the first shaft member and electrically connected to the electromagnetic wave-shielding wall.

Preferably, in the above-described power transmission device, the rotating shaft further includes another shaft joint part provided on the other end opposite to the end of the first shaft member and a third shaft member provided to be rotatable together with the first shaft member with the other shaft joint part interposed between the first and the third shaft members. The third shaft member is formed of a conductive material. The other shaft joint part has another insulating part. The other insulating part is formed of an insulating material and blocks propagation of an electromagnetic wave between the first shaft member and the third shaft member.

Preferably, in the above-described power transmission device, another bearing pivotally supporting the third shaft member is further included. The other bearing includes another inner race component part. The other inner race component part is arranged opposite to the outer race component part and formed to fit to the third shaft member and to be rotatable. The outer race component part is arranged to cover entire outer circumferential surface of the rotating shaft from the bearing to the other bearing.

Effects of the Invention

According to the power transmission device of the present invention, an outer race component part of a bearing pivotally supporting a first shaft member of a rotating shaft is fixed to an electromagnetic wave-shielding wall, and the bearing is grounded via the electromagnetic wave-shielding wall. Further, a shaft joint part having an insulating part is arranged on the second space side relative to the bearing. This makes an electromagnetic wave propagating from the first space side to the second space side by way of the rotating shaft relatively more likely to be transmitted from the first shaft member to the bearing than from the first shaft member to the shaft joint part. That is, most of an electromagnetic wave propagated from the first space side to the first shaft member will propagate to the grounded bearing. Accordingly, the propagation of an electromagnetic wave from the first shaft member to the second shaft member by way of the shaft joint part can be suppressed, and therefore, leakage of an electromagnetic wave from the first space to the second space by way of the rotating shaft can be suppressed.

Figure 1:
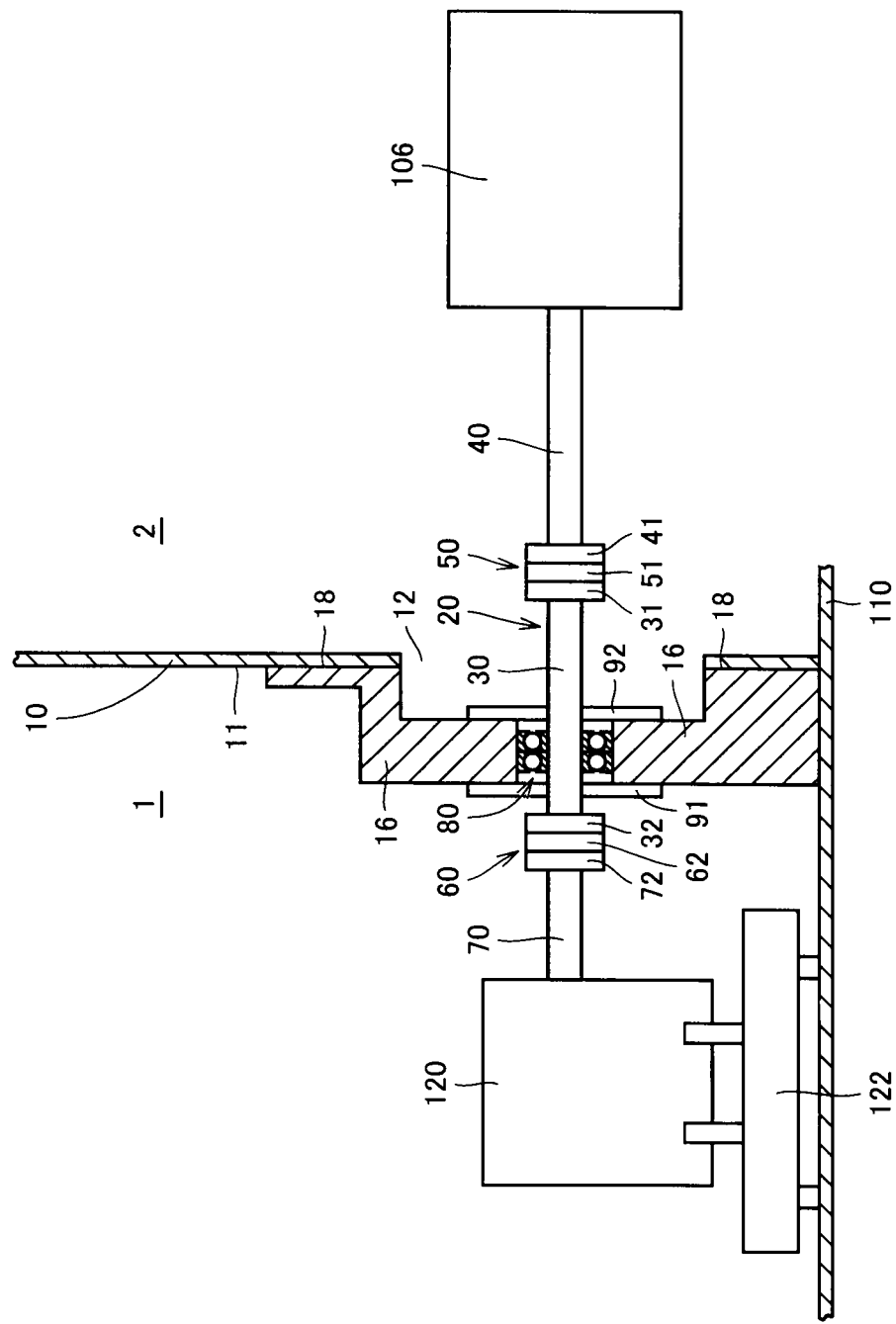
FIG. 1 is a partial cross sectional schematic view illustrating the configuration of a power transmission device according to a first embodiment of the present invention.

DESCRIPTION OF THE REFERENCE SIGNS 1,2 space, 10 electromagnetic wave-shielding wall, 11 surface, 12 through hole, 16, 116 bearing stand, 16a sleeve part, 18 close-contact surface, 20 rotating shaft, 30 first shaft member, 31, 41, 72, 171 end, 32, 71 the other end, 33, 43 bolt, 34, 44 nut, 35, 42 through hole, 39, 79 outer circumferential surface, 40 second shaft member, 50, 60, 160 shaft joint part, 51, 62, 161 coupling, 70 second shaft member, 80, 180 bearing, 91, 92 earthing brush, 93, 95 brush part, 94, 96 wire, 106 driven body, 110 floor part, 122 bed, 120 driver, 123 earth part, 170 fourth shaft member.

BEST MODES FOR CARRYING OUT THE INVENTION

Embodiments of the present invention will be described hereinafter with reference to the drawings. In the drawings below, the same or corresponding elements have the same reference numerals allotted, and description thereof will not be repeated.

In the embodiments described hereinafter, each component is not necessarily indispensable in the present invention unless otherwise specified. In addition, in the embodiments below, reference to the number, an amount or the like is merely by way of example unless otherwise specified, and the scope of the present invention is not necessarily limited to that number, that amount or the like.

First Embodiment

FIG. 1 is a partial cross sectional schematic view illustrating the configuration of a power transmission device according to a first embodiment of the present invention. A space 1 serving as a first space forms the external space of a radio wave-shielding structural body. A space 2 serving as a second space forms the internal space of the radio wave-shielding structural body. Spaces 1 and 2 are formed as the spaces separated and partitioned by an electromagnetic wave-shielding wall 10 and adjacent to each other. Electromagnetic wave-shielding wall 10 shields an electromagnetic wave propagating from one to the other of space 1 and space 2. Electromagnetic wave-shielding wall 10 for blocking the propagation of an electromagnetic wave between space 1 and space 2 is provided such that the propagation of an electromagnetic wave generated by a driver 120 installed in space 1 to space 2 is blocked. Driver 120 is placed on a bed 122 provided on the floor part 110. This grounds driver 120.

Formed in electromagnetic wave-shielding wall 10 is a through hole 12. Through hole 12 is formed by drilling a hole penetrating through electromagnetic wave-shielding wall 10 in the thickness direction in a portion of electromagnetic wave-shielding wall 10. A rotating shaft 20 is disposed in a manner to extend through the inside of through hole 12 from space 1 to space 2. Rotating shaft 20 penetrates through electromagnetic wave-shielding wall 10 to transmit rotational drive force between driver 120 arranged within space 1 and a driven body 106 arranged within space 2. Rotating shaft 20 is provided in a manner to be able to transmit rotating drive force between space 1 and space 2 which are partitioned by electromagnetic wave-shielding wall 10.

Figure 2:
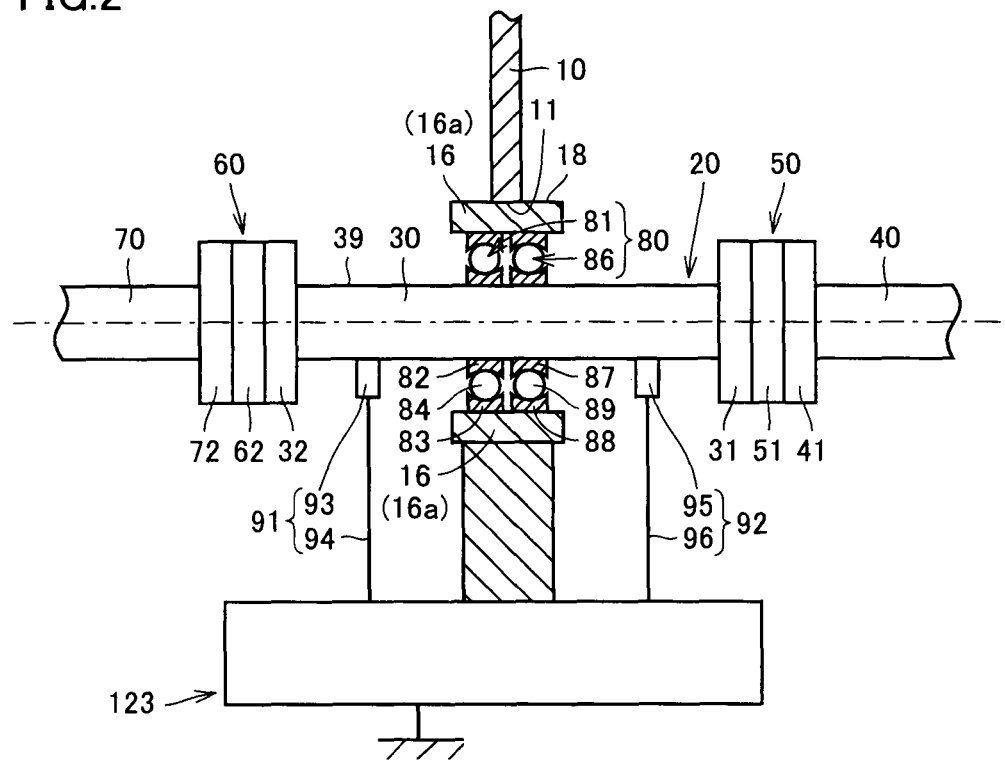
FIG. 2 is a conceptual view illustrating details and the grounding status of a rotating shaft.

FIG. 2 is a conceptual view illustrating details and the grounding status of rotating shaft 20. As shown in FIGS. 1 and 2, rotating shaft 20 is rotatably supported by a bearing 80. Bearing 80 includes two rolling bearings 81, 86.

Rolling bearing 81 has inner and outer races 82 and 83 formed into a circular ring shape and a ball 84 serving as a rolling element which is held by and between inner race 82 and outer race 83. A plurality of balls 84 are in contact with the inner circumferential surface of outer race 83 and the outer circumferential surface of inner race 82 and arranged with a predetermined pitch in the circumferential direction by a cage which is not shown in the drawings, thereby being rollably held on a circular ring-like track. Inner race 82 and outer race 83, which are arranged opposite to each other, are allowed to rotate relative to each other. Inner race 82 and outer race 83 are arranged in an opposing and relatively rotatable manner.

Rolling bearing 86 has inner and outer races 87 and 88 formed into a circular ring shape and a ball 89 serving as a rolling element which is held by and between inner race 87 and outer race 88. A plurality of balls 89 are in contact with the inner circumferential surface of outer race 88 and the outer circumferential surface of inner race 87 and arranged with a predetermined pitch in the circumferential direction by a cage which is not shown in the drawings, thereby being rollably held on a circular ring-like track. Inner race 87 and outer race 88, which are arranged opposite to each other, are allowed to rotate relative to each other. Inner race 87 and outer race 88 are arranged in an opposing and relatively rotatable manner.

Outer races 83, 88 are supported by a bearing stand 16 in a fixed manner. Bearing stand 16 is fixed to electromagnetic wave-shielding wall 10 and bearing stand 16 and electromagnetic wave-shielding wall 10 are electrically connected. Bearing stand 16 has a close-contact surface 18 which is in close contact with electromagnetic wave-shielding wall 10. Close-contact surface 18 is formed annularly. Close-contact surface 18 of bearing stand 16 is, with no clearance, in close contact with a surface 11 which is one surface of electromagnetic wave-shielding wall 10. Bearing stand 16 is provided as a construction in a single-piece with electromagnetic wave-shielding wall 10. Outer races 83, 88 surrounding the circumference of rotating shaft 20 in the circumferential direction with no clearance are supported from their outer circumferential sides by bearing stand 16 which has a cylindrical sleeve part 16a (see FIG. 2) covering the circumference of rotating shaft 20 with no clearance.

Rotating shaft 20 includes a first shaft member 30, a second shaft member 40, and a shaft joint part 50 lying between first shaft member 30 and second shaft member 40. Rotating shaft 20 also includes a third shaft member 70 and another shaft joint part 60 lying between first shaft member 30 and third shaft member 70. Bearing 80 pivotally supports first shaft member 30, thereby rotatably supporting rotating shaft 20. First shaft member 30 is pivotally supported by bearing 80. First shaft member 30 is arranged to span from space 1 to space 2 with an end 31 being arranged on the space 2 side and the other end 32 opposite to end 31 being arranged on space 1 side.

End 31 and the other end 32 of first shaft member 30 are formed into a flange shape which is enlarged in diameter. Shaft joint part 50 is provided at end 31 of first shaft member 30. The other shaft joint part 60 is provided at the other end 32 of first shaft member 30. Second shaft member 40 is provided to be rotatable together with first shaft member 30 with shaft joint part 50 interposed therebetween. Third shaft member 70 is provided to be rotatable together with first shaft member 30, with the other shaft joint part 60 interposed therebetween. First shaft member 30, second shaft member 40 and third shaft member 70 are made to be coaxially rotatable.

Shaft joint part 50 has end 31 of first shaft member 30, end 41 of second shaft member 40 and a coupling 51. Coupling 51 is an example of an insulating part formed of an insulating material. Although first shaft member 30 and second shaft member 40 are formed of a conductive material, insulating coupling 51 provided between ends 31, 41 provides a configuration in which the propagation of an electromagnetic wave between first shaft member 30 and second shaft member 40 can be blocked.

Figure 3:
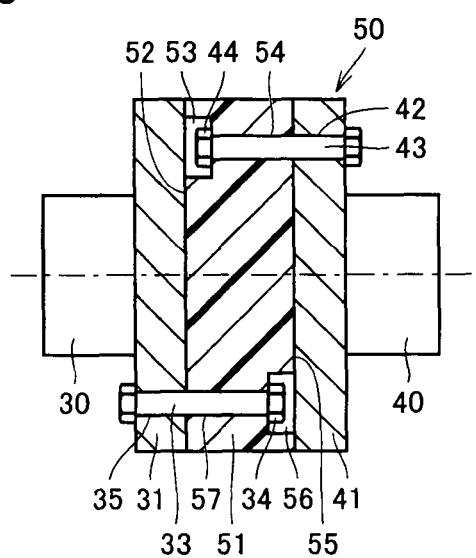
FIG. 3 is a cross sectional view illustrating an example of details of the structure of a shaft joint part.
Figure 4:
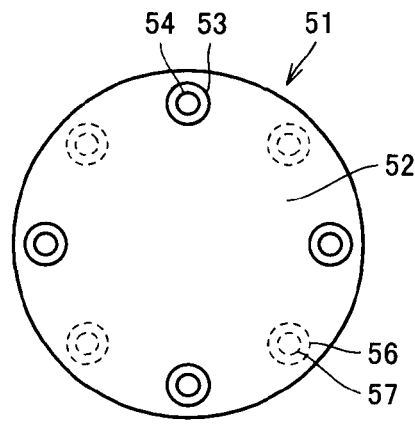
FIG. 4 is a front view of an example of a coupling.

FIG. 3 is a cross sectional view illustrating an example of details of the structure of shaft joint part 50. FIG. 4 is a front view of an example of coupling 51. FIG. 4 shows coupling 51 shown in FIG. 3 when viewed from the left side in FIG. 3. As shown in FIGS. 3 and 4, on a surface 52 of coupling 51, a dent part 53 is formed at four locations. Dent part 53 is formed such that surface 52 of coupling 51 is concaved and has a cylindrical internal surface. A bolt hole 54 penetrating through coupling 51 in the thickness direction is so formed as to reach from the bottom surface of each dent part 53 to the back side 55 of coupling 51.

In flange-like end 41 of second shaft member 40, a through hole 42 is formed at four locations. Through hole 42 is formed to be equal to bolt hole 54 in diameter and phase. A bolt 43 is inserted into the through hole 42 and bolt hole 54 in a manner to penetrate therethrough, and fixation of bolt 43 with a nut 44 fixes coupling 51 and end 41 of second shaft member 40 together.

Likewise, on back side 55 of coupling 51, a dent part 56 is formed at four locations. A bolt hole 57 penetrating through coupling 51 in the thickness direction is so formed to reach from the bottom surface of each dent part 56 to the front side 52 of coupling 51. In flange-like end 31 of first shaft member 30, a through hole 35 is formed at four locations to be equal to bolt hole 57 in diameter and phase. A bolt 33 is inserted into through the through holes 35 and bolt hole 57 in a manner to penetrate therethrough, and fixation of bolt 33 with a nut 34 fixes coupling 51 and end 31 of first shaft member 30 together.

By screw engagement using bolts 33, 43, end 31 of first shaft member 30 and end 41 of second shaft member 40 are coupled together, with coupling 51 interposed therebetween. At this time, as shown in FIG. 3, bolt 33 and nut 34 coupling first shaft member 30 and coupling 51 are not in contact with second shaft member 40, and a clearance is formed between bolt 33 and nut 34 and end 41 of second shaft member 40. Further, bolt 43 and nut 44 coupling second shaft member 40 and coupling 51 are not in contact with first shaft member 30, and a clearance is formed between bolt 43 and nut 44 and end 31 of first shaft member 30.

As such, first shaft member 30 and second shaft member 40 are not in direct contact with each other, insulating coupling 51 lies between first shaft member 30 and second shaft member 40, and the electrical resistance between first shaft member 30 and second shaft member 40 is large. This makes an electromagnetic wave unlikely to be propagated between first shaft member 30 and second shaft member 40. Since first shaft member 30 and second shaft member 40 are coupled to each other, with shaft joint part 50 interposed therebetween and having coupling 51 serving as an insulating part, an electromagnetic wave propagating from the space 1 side to the space 2 side by way of rotating shaft 20 is made unlikely to be transmitted from first shaft member 30 to shaft joint part 50.

On the other hand, bearing 80 pivotally supporting first shaft member 30 includes an inner race component part which is formed to fit to an outer circumferential surface 39 of first shaft member 30 and to be rotatable. This inner race component part includes inner races 82, 87. Bearing 80 also includes an outer race component part which is arranged opposite to the inner race component part with balls 84, 89 interposed therebetween. This outer race component part has outer races 83, 88 and bearing stand 16 (sleeve part 16a) for fixing outer races 83, 88. The inner circumferential surface of outer races 83, 88 forms a track surface of bearing 80 (rolling bearings 81, 86), together with the outer circumferential surface of inner races 82, 87.

The inner race component part, the rolling element, and the outer race component part are each formed of a conductive material such as a metal material, which is represented by bearing steel. An electromagnetic wave propagates to a path having a lower electrical resistance value. This makes an electromagnetic wave more likely to be transmitted from first shaft member 30 to the outer race component part by way of the inner race component part and the rolling element. As described above, the outer race component part is in close contact with electromagnetic wave-shielding wall 10. Bearing stand 16 included in the outer race component part is electrically connected to an earth part 123 which is a conductive body. Bearing 80 rotatably supporting first shaft member 30 is grounded (earthed) via earth part 123.

If an electromagnetic wave is propagated from the space 1 side to first shaft member 30, since the transmission of an electromagnetic wave from first shaft member 30 to shaft joint part 50 is suppressed, much of the propagated electromagnetic wave to first shaft member 30 will then propagate to grounded bearing 80. Consequently, the propagation of an electromagnetic wave from first shaft member 30 to second shaft member 40 by way of shaft joint part 50 can be suppressed, and therefore, leakage of an electromagnetic wave from space 1 to space 2 by way of rotating shaft 20 can be suppressed, achieving reduction of leakage of an electromagnetic wave to space 2.

As already described, outer race 83 of rolling bearing 81 and outer race 88 of rolling bearing 86 are supported by bearing stand 16 (sleeve part 16a) in a fixed manner. The outer peripheral surface of sleeve part 16a is formed into a cylindrical shape. For instance, this outer peripheral surface having a cylindrical shape can be brought into close contact with electromagnetic wave-shielding wall 10 to form annular close-contact surface 18. Further, annular close-contact surface 18 may be formed by bringing a circular ring-shaped surface formed on an end of sleeve part 16a into close contact with electromagnetic wave-shielding wall 10.

In order to prevent formation of any clearance between sleeve part 16a and electromagnetic wave-shielding wall 10, by bringing sleeve part 16a into close contact with electromagnetic wave-shielding wall 10 directly or with another member interposed therebetween, the outer circumferential surface of rotating shaft 20 on the side in the proximity of shaft joint part 50 relative to bearing 80 (i.e., on the space 2 side) is circumferentially surrounded with no clearance. Thus, even when the electromagnetic wave density within space 1 is higher than that within space 2 due to generation of an electromagnetic wave from driver 120, rotating shaft 20 located on the space 2 side relative to bearing 80 will not be in direct contact with the high electromagnetic wave density. Thus, upon release of, by way of bearing 80, an electromagnetic wave propagating through rotating shaft 20, the propagation of an electromagnetic wave from space 1 to rotating shaft 20 can be prevented. Therefore, leakage of an electromagnetic wave to space 2 by way of rotating shaft 20 can be more effectively suppressed.

As shown in FIG. 2, the other shaft joint part 60 lying between first shaft member 30 and third shaft member 70 has the other end 32 of first shaft member 30, end 72 of third shaft member 70 and a coupling 62. Coupling 62 is an example of another insulating part formed of an insulating material. Although first shaft member 30 and third shaft member 70 are formed of a conductive material, insulating coupling 62 provided between the other end 32 of first shaft member 30 and end 72 of the third shaft member provides a configuration in which the propagation of an electromagnetic wave between first shaft member 30 and third shaft member 70 can be suppressed.

The other shaft joint part 60 can be formed to have the same configuration as shaft joint part 50 described with reference to FIGS. 3 and 4. By doing so, first shaft member 30 and third shaft member 70 will not be in direct contact with each other. Insulating coupling 62 interposed between first shaft member 30 and third shaft member 70 increases the electrical resistance between first shaft member 30 and third shaft member 70. This makes an electromagnetic wave unlikely to be propagated between first shaft member 30 and third shaft member 70.

That is, since first shaft member 30 and third shaft member 70 are coupled to each other, with shaft joint part 60 interposed therebetween and having coupling 62 serving as another insulating part, an electromagnetic wave propagating from the space 1 side to the space 2 side by way of rotating shaft 20 is made unlikely to be transmitted from third shaft member 70 to shaft joint part 60. An electromagnetic wave to be transmitted by way of rotating shaft 20 to first shaft member 30 is attenuated when passing through shaft joint part 60. Accordingly, by providing the other shaft joint part 60, an electromagnetic wave propagated to first shaft member 30 by way of rotating shaft 20 can reduced, and therefore, leakage of an electromagnetic wave from space 1 to space 2 by way of first shaft member 30 can be further suppressed.

Further, as shown in FIGS. 1 and 2, earthing brushes 91, 92 as an example of a grounding member are in contact with outer circumferential surface 39 of first shaft member 30. Earthing brushes 91, 92 have brush parts 93, 95 formed of a conductive material and in contact with outer circumferential surface 39 of first shaft member 30, as shown in FIG. 2. Earthing brushes 91, 92 also have wires 94, 96 electrically connecting brush parts 93, 95 and earth part 123. Earthing brushes 91, 92 electrically connect outer circumferential surface 39 of first shaft member 30 and electromagnetic wave-shielding wall 10. Earthing brushes 91, 92 ground first shaft member 30.

By providing earthing brushes 91, 92, paths electrically connecting first shaft member 30 and electromagnetic wave-shielding wall 10 are increased in number. If an electromagnetic wave propagated to first shaft member 30 propagates to any of bearing 80 and earthing brushes 91, 92, then an electromagnetic wave propagating to second shaft member 40 can be reduced. Accordingly, leakage of an electromagnetic wave from space 1 to space 2 by way of rotating shaft 20 can be effectively suppressed, achieving a further reduction of leakage of an electromagnetic wave to space 2.

Earthing brushes 91, 92 are arranged to be in contact with outer circumferential surface 39 which is the outer surface of first shaft member 30. The higher frequency an electromagnetic wave propagating through rotating shaft 20 has, the more an electromagnetic wave propagating by way of the surface of rotating shaft 20 increases, due to the skin effect. Therefore, by bringing earthing brushes 91, 92 into contact with first shaft member 30 which forms a path for an electromagnetic wave of a high frequency, an electromagnetic wave traveling though the surface of first shaft member 30 can be effectively blocked, achieving a further improvement in blocking performance against an electromagnetic wave of high frequency.

Second Embodiment

Figure 5:
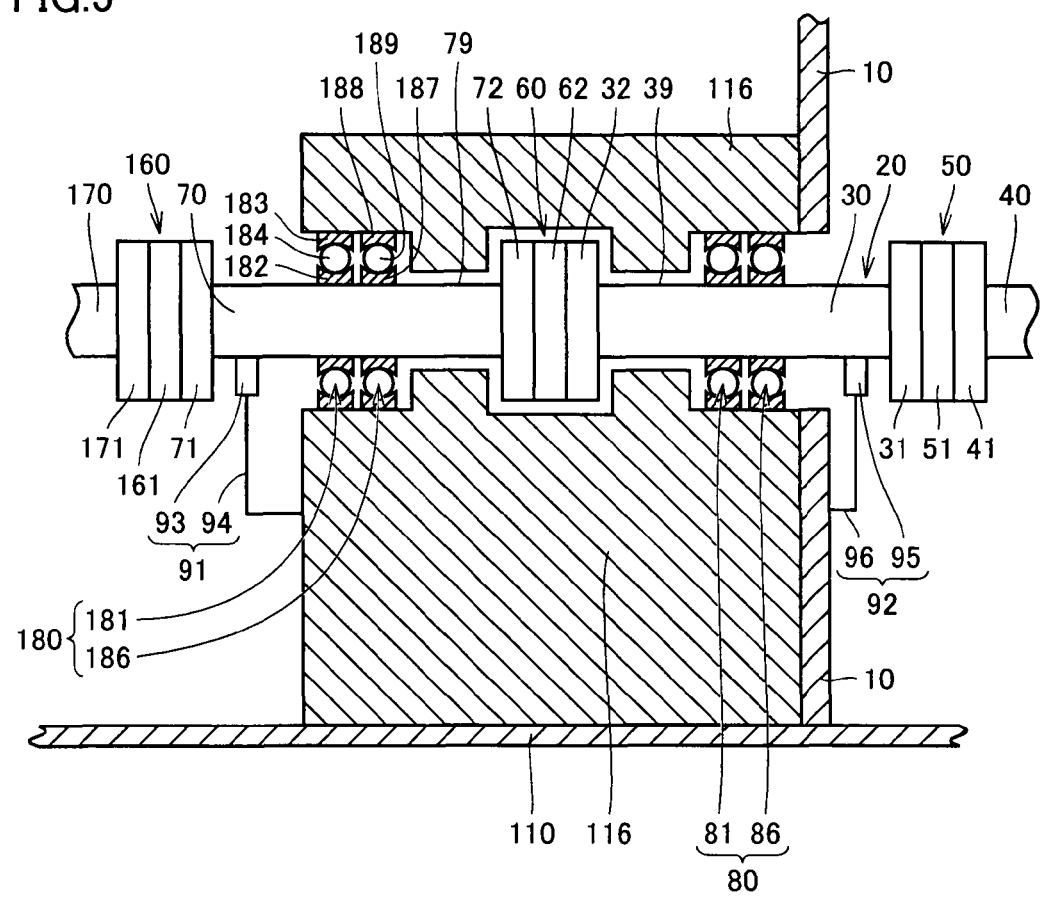
FIG. 5 is a partial cross sectional schematic view illustrating the configuration of a power transmission device according to a second embodiment.

FIG. 5 is a partial cross sectional schematic view illustrating the configuration of a power transmission device according to a second embodiment. The power transmission device of the second embodiment varies from that of the first embodiment in that the device further includes another bearing 180 pivotally supporting third shaft member 70 and that a bearing stand 116 included in an outer race component part of bearings 80, 180 is arranged to cover entire outer circumferential surfaces 39, 79 of rotating shaft 20 from bearing 80 to the other bearing 180.

The other bearing 180 includes two rolling bearings 181, 186, as in bearing 80. Rolling bearings 181, 186 have inner races 182, 187 and outer races 183, 188 formed into a circular ring shape and balls 184, 189 serving as rolling elements which are held by and between inner races 182, 187 and outer races 183, 188, respectively. Inner races 182, 187 are included in an inner race component part, and outer races 183, 188 and bearing stand 116 supporting outer races 183, 188 in a fixed manner are included in an outer race component part. Inner races 182, 187 included in another inner race component part are arranged opposite to the outer race component part including bearing stand 116, and formed to fit to third shaft member 70 and to be rotatable.

A plurality of balls 184, 189 are in contact with the inner circumferential surface of outer races 183, 188 and the outer circumferential surface of inner races 182, 187 and arranged with a predetermined pitch in the circumferential direction by a cage which is not shown in the drawings, thereby being rollably held on circular ring-like tracks. Inner races 182, 187 and outer races 183, 188, which are arranged opposite to each other, are allowed to rotate relative to each other. Inner races 182, 187 and outer races 183, 188 are arranged in an opposing and relatively rotatable manner.

Bearing stand 116 is fixed to electromagnetic wave-shielding wall 10, and bearing stand 116 and electromagnetic wave-shielding wall 10 are electrically connected. Bearing stand 116 is in close contact with electromagnetic wave-shielding wall 10 with no clearance. Bearing stand 116 is provided as a single-piece construction with electromagnetic wave-shielding wall 10. Outer races 183, 188 encircling the circumference of rotating shaft 20 in the circumferential direction with no clearance are supported, from their outer circumferential sides, by bearing stand 116 which is formed into a tubular shape covering the circumference of rotating shaft 20 with no clearance.

In rotating shaft 20 of the second embodiment having a configuration as above, since first shaft member 30 and third shaft member 70 are coupled to each other, with the other shaft joint part 60 interposed therebetween and having coupling 62 serving as another insulating part, an electromagnetic wave propagating from the space 1 side to the space 2 side by way of rotating shaft 20 is made unlikely to be transmitted from third shaft member 70 to the other shaft joint part 60. Meanwhile, the inner race component part, the rolling elements and the outer race component part of the other bearing 180 are each formed of a conductive material such as a metal material, which is represented by bearing steel. This makes an electromagnetic wave more likely to be transmitted from third shaft member 70 to the outer race component part by way of the inner race component part and rolling elements of the other bearing 180.

The other bearing 180 rotatably supporting third shaft member 70 is grounded (earthed) via bearing stand 116. If an electromagnetic wave is propagated from the space 1 side to third shaft member 70, since the transmission of an electromagnetic wave from third shaft member 70 to the other shaft joint part 60 is suppressed, much of the propagated electromagnetic wave to third shaft member 70 will then propagate to the grounded another bearing 180. Consequently, the propagation of an electromagnetic wave from third shaft member 70 to first shaft member 30 by way of the other shaft joint part 60 can be suppressed, and therefore, leakage of an electromagnetic wave from space 1 to space 2 by way of rotating shaft 20 can be further suppressed, achieving a further reduction of leakage of an electromagnetic wave to space 2.

In order to prevent formation of any clearance between bearing stand 116 and electromagnetic wave-shielding wall 10, by bringing bearing stand 116 into close contact with electromagnetic wave-shielding wall 10, the outer circumferential surface of rotating shaft 20 on the side in the proximity of the other shaft joint part 60 relative to the other bearing 180 (i.e., on the space 2 side) is circumferentially surrounded with no clearance. Thus, upon release of, by way of bearing 180, an electromagnetic wave propagating through rotating shaft 20, the propagation of an electromagnetic wave from space 1 to rotating shaft 20 can be prevented. Therefore, leakage of an electromagnetic wave to space 2 by way of rotating shaft 20 can be more effectively suppressed.

As shown in FIG. 5, on the other end 71 of third shaft member 70, a shaft joint part 160 is provided. Shaft joint part 160 has the other end 71 of third shaft member 70, a coupling 161 formed of an insulating material, and an end 171 of a fourth shaft member 170 coupled to third shaft member 70 with coupling 161 interposed therebetween. As described in the first embodiment, because insulating coupling 161 is provided between end 171 of fourth shaft member 170 and the other end 71 of the third shaft member, the propagation of an electromagnetic wave between fourth shaft member 170 and third shaft member 70 can be blocked.

That is, since fourth shaft member 170 and third shaft member 70 are coupled to each other, with shaft joint part 160 interposed therebetween and having coupling 161, an electromagnetic wave propagating from the space 1 side to the space 2 side by way of rotating shaft 20 is made unlikely to be transmitted from fourth shaft member 170 to shaft joint part 160. Accordingly, by providing shaft joint part 160, an electromagnetic wave propagated by way of rotating shaft 20 to first shaft member 30 can reduced, and therefore, leakage of an electromagnetic wave from space 1 to space 2 by way of first shaft member 30 can be further suppressed.

It is noted that bearing stand 116 of the second embodiment covers a wider range of the outer circumferential surface of rotating shaft 20 as compared with bearing stand 16 of the first embodiment. Earthing brush 91 is arranged to electrically connect outer circumferential surface 79 of third shaft member 70 and bearing stand 116. Earthing brush 92 are arranged to electrically connect outer circumferential surface 39 of first shaft member 30 and electromagnetic wave-shielding wall 10.

Earthing brushes 91, 92 for effectively eliminating an electromagnetic wave of a high frequency propagating through the surface of rotating shaft 20 may be installed at any position. There is, however, a need to replace earthing brushes 91, 92 when earthing brushes 91, 92 are worn due to their sliding movement against rotating shaft 20. In order to improve ease of maintenance, it is desirable to arrange earthing brushes 91, 92 at positions which allow for easy changing of earthing brushes 91, 92. Specifically, it is desirable, as shown in FIG. 5, for example, to arrange earthing brushes 91, 92 to be in contact with rotating shaft 20 at a position where the outer circumferential surface thereof is not covered with bearing stand 116.

It is noted that in the descriptions of the first and second embodiments, descriptions are given of examples where bearings 80, 180 pivotally supporting rotating shaft 20 include rolling bearings 81, 86, 181 and 186. In the bearing supporting rotating shaft 20 of the present invention, a roller may be used as a rolling element in lieu of a ball. Further, instead of a rolling bearing, a sliding bearing may be used to pivotally support rotating shaft 20.

Further, shaft joint parts 50, 60, 160 are not limited to the configurations shown in FIGS. 3 and 4. Shaft joint parts 50, 60, 160 can, rather, be applied with any configuration in so far as shaft joint parts 50, 60, 160 have insulating parts formed of an insulating material and can suppress the propagation of an electromagnetic wave between two shaft members coupled by shaft joint parts 50, 60, 160.

Although the embodiments of the present invention have been described as above, it should be construed that embodiments disclosed herein are by way of illustration in all respects, not by way of limitation. It is intended that the scope of the present invention is defined by claims, not by the above description, and includes all modifications equivalent in meaning and scope to the claims.

INDUSTRIAL APPLICABILITY

The present invention is advantageously applicable in particular to a power transmission device for transmitting rotating drive force by means of a rotating shaft penetrating through a wall part of a radio wave-shielded room, from the outside to the inside (or from the inside to the outside) of the radio wave-shielding room.

The invention claimed is:

1. A power transmission device comprising:

an electromagnetic wave-shielding wall partitioning a first space and a second space adjacent to said first space and blocking propagation of an electromagnetic wave between said first space and said second space;

a rotating shaft rotatably provided and penetrating through said electromagnetic wave-shielding wall to transmit rotational drive force between said first space and said second space; and a bearing rotatably supporting said rotating shaft, said rotating shaft including a first shaft member supported by said bearing, a shaft joint part provided on an end of said first shaft member on said second space side, and a second shaft member provided to be rotatable together with said first shaft member with said shaft joint part interposed between said first and second shaft members, said first shaft member and said second shaft member being formed of a conductive material, said shaft joint part having an insulating part formed of an insulating material and blocking propagation of an electromagnetic wave between said first shaft member and said second shaft member, said bearing including an inner race component part and an outer race component part arranged opposite to each other, said inner race component part being formed to fit to said first shaft member and to be rotatable, said outer race component part being formed of a conductive material, being fixed to said electromagnetic wave-shielding wall, and having an annular close-contact surface in close contact with said electromagnetic wave-shielding wall, said rotating shaft further includes another shaft joint part provided on another end opposite to said end of said first shaft member and a third shaft member provided to be rotatable together with said first shaft member with said another shaft joint part interposed between said first and third shaft members, said third shaft member is formed of a conductive material, said another shaft joint part has another insulating part formed of an insulating material and blocking propagation of an electromagnetic wave between said first shaft member and said third shaft member, and said power transmission device further including comprising another bearing supporting said third shaft member, wherein said another bearing includes another inner race component part arranged opposite to said outer race component part and formed to fit to said third shaft member and to be rotatable, and said outer race component part is arranged to cover entire outer circumferential surface of said rotating shaft from said bearing to said another bearing.

2. The power transmission device according to claim 1, further comprising a grounding member formed of a conductive material, wherein said grounding member is arranged to be in contact with an outer circumferential surface of said first shaft member and electrically connected to said electromagnetic wave-shielding wall.

* * * * *